United States Patent [19]
Koshimizu

[11] Patent Number: 6,000,360
[45] Date of Patent: Dec. 14, 1999

[54] PLASMA PROCESSING APPARATUS

[75] Inventor: Chishio Koshimizu, Yamanashi-ken, Japan

[73] Assignee: Tokyo Electron Limited, Tokyo, Japan

[21] Appl. No.: 08/887,084

[22] Filed: Jul. 2, 1997

[30] Foreign Application Priority Data

Jul. 3, 1996 [JP] Japan .................................. 8-193987

[51] Int. Cl.$^6$ .................................................. C23C 16/00
[52] U.S. Cl. .............................. 118/723 E; 118/723 MA; 118/723 I; 156/345
[58] Field of Search .......................... 118/723 E, 723 I, 118/723 AN, 723 MA; 156/345; 315/111.21, 111.41, 111.51; 204/298.06, 298.16, 298.34, 298.37

[56] References Cited

U.S. PATENT DOCUMENTS

| | | | |
|---|---|---|---|
| 5,113,790 | 5/1992 | Geisler et al. | 118/723 |
| 5,605,576 | 2/1997 | Sasaki et al. | 118/723 E |
| 5,609,690 | 3/1997 | Watanabe et al. | 118/723 E |
| 5,733,405 | 3/1998 | Taki et al. | 156/345 |
| 5,767,628 | 6/1998 | Keller et al. | 315/111.51 |
| 5,795,429 | 8/1998 | Ishii et al. | 156/345 |

FOREIGN PATENT DOCUMENTS 62-286227 12/1987 Japan .

Primary Examiner—Bruce Breneman
Assistant Examiner—Luz Alejandro
Attorney, Agent, or Firm—Oblon, Spivak, McClelland, Maier & Neustadt, P.C.

[57] ABSTRACT

The plasma processing apparatus according to the present invention comprises a processing chamber in which an object to be processed is processed, a lower electrode provided at a lower portion in the processing chamber, having a mount surface where the object is mounted, and applied with a bias voltage, gas introduce tube for introducing a processing gas into the processing chamber, an upper electrode provided fixedly on a roof portion of the processing chamber and supplied with a high-frequency power, to form plasma from the processing gas in the processing chamber, and a magnetic field formation portion provided fixedly on the roof portion of the processing chamber, for forming a magnetic field in the processing chamber. The the upper electrode and the magnetic field formation portion are arranged such that a force for moving circularly electrons in the plasma is generated in the processing chamber and such that two or more circular flows of electrons which are coaxial with each other and have turning radii different from each other are generated by the force.

17 Claims, 5 Drawing Sheets

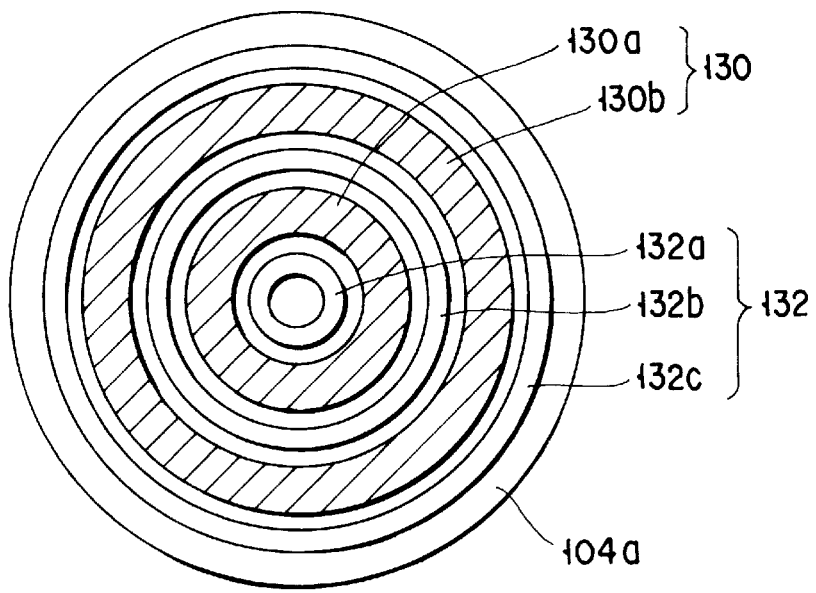
F I G. 2
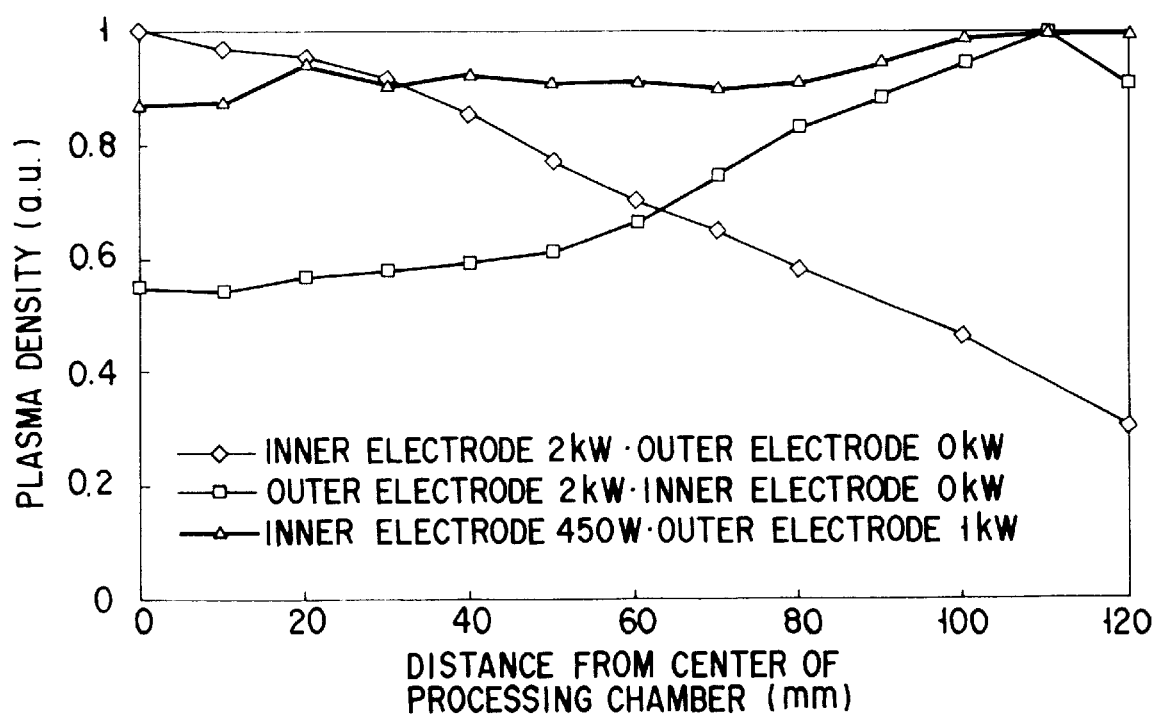
F I G. 3

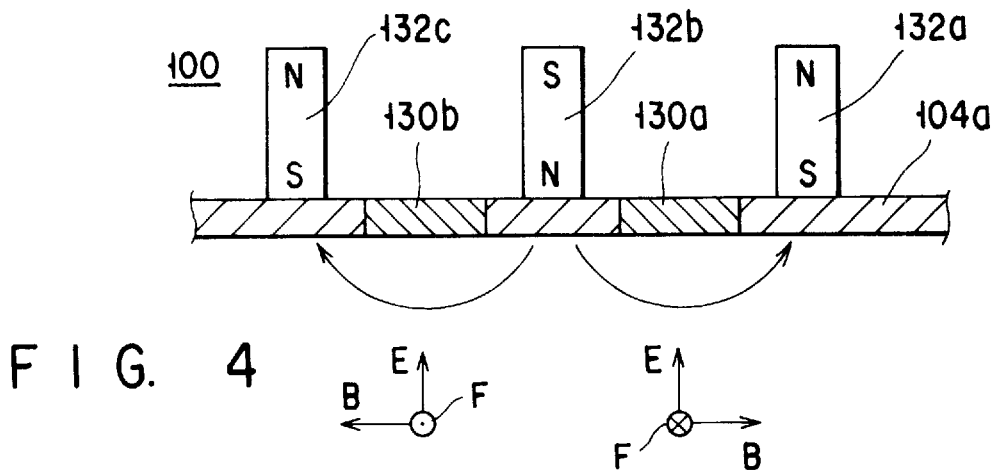
F I G. 4
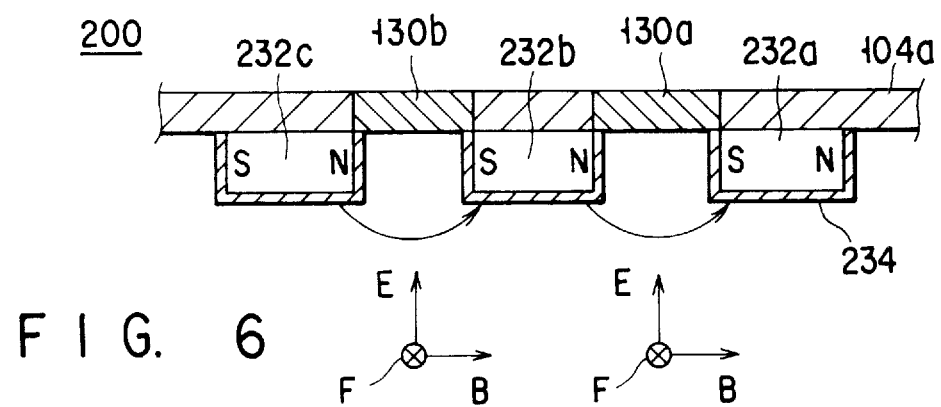
F I G. 6
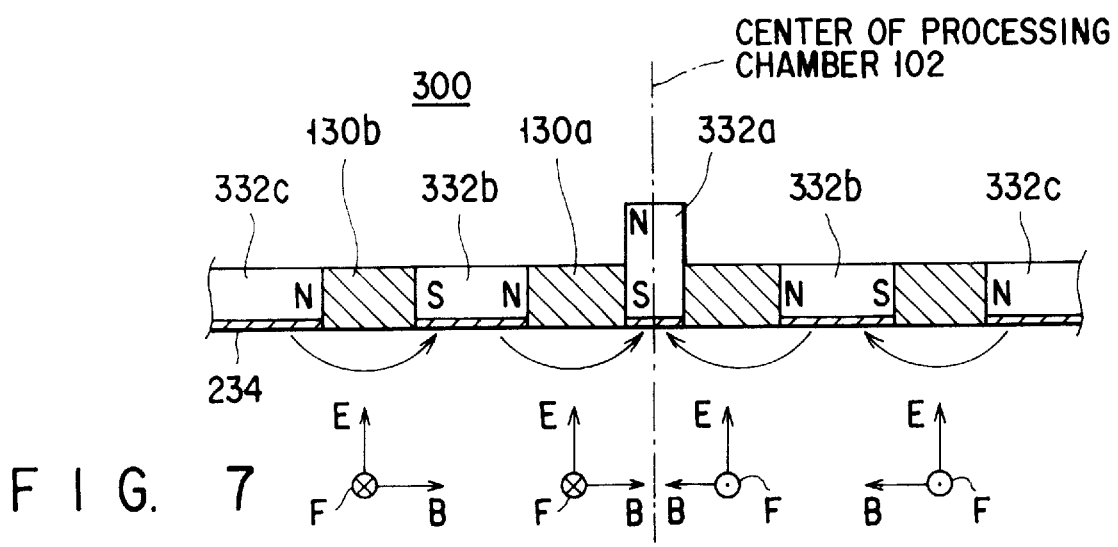
F I G. 7

PLASMA PROCESSING APPARATUS

BACKGROUND OF THE INVENTION

The present invention relates to a plasma processing apparatus, and particularly, to a high-frequency plasma processing apparatus of a magnetic-field assist type.

FIG. 10 shows a typical conventional plasma processing apparatus 1 of a magnetic-field assist type. The apparatus 1 comprises a processing chamber 10, an electrode 14 which serves as a mount base provided in the chamber 10, and a high-frequency power source 18 for applying a high-frequency voltage of a predetermined frequency to the electrode 14. In this structure, when a high-frequency voltage is applied to the electrode 14 by the high-frequency power source 18, a processing gas introduced into the processing chamber 10 is changed into plasma, thereby generating radicals and ions by which an etching processing (plasma processing) is performed on an object to be processed which is mounted on the electrode 14, for example. In this case, to achieve uniform etching, a permanent magnet 20 provided above the processing chamber 10 is rotated, to attempt to make uniform the plasma density over the entirety of a plasma formation region due to an effect of a magnetic field.

However, in the plasma processing apparatus shown in FIG. 10, the plasma density is the highest in the vicinity of inner walls of the processing chamber 10, due to so-called E×B drifting, so that it is difficult to obtain a uniform etching rate. In addition, a charge-up damage tends to easily occur due to deflection of plasma. This tendency is particularly outstanding under a low pressure. In the current situation in which high integration of integrated circuits has been promoted, a plasma source capable of generating high density plasma under a low pressure has been demanded and therefore, solution of the problem as described above has also been demanded. Further, it is difficult for the plasma processing apparatus shown in FIG. 10 to control the density distribution of plasma to be generated in compliance with processing conditions.

BRIEF SUMMARY OF THE INVENTION

The present invention has a first object of providing a plasma processing apparatus by which plasma with a high density is obtained under a low pressure and the plasma density can be made uniform over the entire region where plasma is formed. In addition, the present invention has a second object of providing a plasma processing apparatus capable of controlling the density distribution of plasma in compliance with processing conditions.

The first object of the present invention is achieved by the following plasma processing apparatus. Specifically, the plasma processing apparatus comprises: a processing chamber in which an object to be processed is processed; a lower electrode provided at a lower portion in the processing chamber, having a mount surface where the object is mounted, and applied with a bias voltage; gas introduce means for introducing a processing gas into the processing chamber; an upper electrode provided fixedly on a roof portion of the processing chamber and supplied with a high-frequency power, to form plasma from the processing gas in the processing chamber; magnetic field formation means provided fixedly on the roof portion of the processing chamber, for forming a magnetic field in the processing chamber; and means for situating the upper electrode and the magnetic field formation means such that a force for moving circularly electrons in the plasma is generated in the processing chamber and such that two or more circular flows of electrons which are substantially coaxial with each other and have turning radii different from each other are generated by the force. Further, in order to achieve the second object, the upper electrode consists of a plurality of electrode portions and the high-frequency power and a phase of the power are controlled individually for each of the electrode portions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a plan view of a processing vessel of the plasma processing apparatus shown in FIG. 1;

FIG. 3 is a graph showing a density distribution of plasma formed in the processing chamber of the plasma processing apparatus shown in FIG. 1;

FIG. 4 is a cross-section of a main part for explaining operation of electrons in the processing chamber of the plasma processing apparatus shown in FIG. 1;

FIG. 6 is a cross-section of a main part for explaining operation of electrons in the processing chamber of the plasma processing apparatus shown in FIG. 5;

FIG. 7 is a cross-section of a main part of a plasma processing apparatus according to a third embodiment of the present invention;

DETAILED DESCRIPTION OF THE INVENTION

In the following, embodiments of the present invention will be explained with reference to the drawings.

Figure 1:
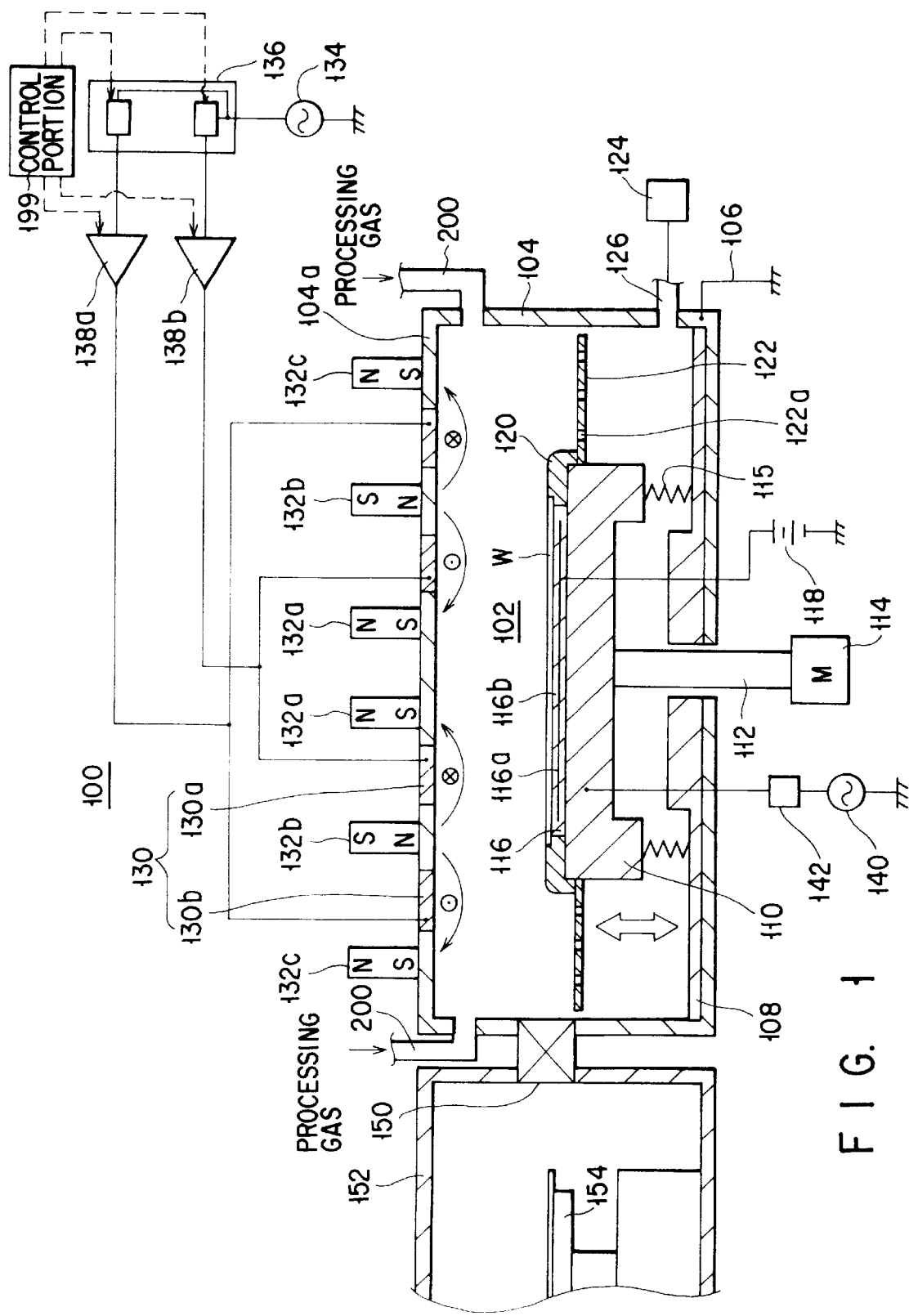
FIG. 1 is a cross-section schematically showing a plasma processing apparatus according to a first embodiment of the present invention.

FIGS. 1 to 4 show a first embodiment of the present invention. As shown in FIG. 1, an etching apparatus 100 as a plasma processing apparatus according to the present invention comprises a processing chamber 102. The processing chamber 102 is formed in a cylindrical processing vessel 104 which can be closed in an air-tight state. The processing vessel 104 is formed of aluminum or the like subjected to processing with alumite oxide and is grounded through a grounding cable 106.

In order to introduce a predetermined processing gas such as an Ar gas, $C_4F_8$ gas, a $CF_4$ gas or the like into the processing chamber 102, a gas introduce tube 200 connected to a processing gas source through a mass-flow controller (not shown) is connected to an upper portion of a side wall of the processing vessel 104. In order that the pressure of the inside of the processing vessel 104 is arbitrarily reduced to 10 mTorr to 100 mTorr, an exhaust tube 126 communicating with a vacuum suction means 124 such as a vacuum pump is connected to a lower portion of the processing vessel 104. A load lock chamber 152 is connected to the processing vessel 104 through a gate valve 150. In the load lock chamber 152, there is provided a transport means 154 such as a transport arm or the like for transporting a wafer W as an object to be processed, between the processing chamber 102 and the load lock chamber 152.

An electrically insulating support plate 108 made of ceramics or the like is provided on the bottom of the processing chamber 102. A substantially columnar susceptor 110 which serves as a lower electrode is provided on the support plate 108, such that the susceptor 110 is movable vertically. The upper surface of the susceptor 110 is formed as a mount surface where a semiconductor wafer W (as an object to be processed) having a diameter of 8 inches, for example, is mounted.

The susceptor 110 is supported by an elevation shaft 112 freely penetrating through the support plate 108 and the bottom of the processing vessel 104. The elevation shaft 112 is moved up and down by a motor 114 provided outside the processing vessel 104. Therefore, when the motor 114 is driven, the susceptor 110 is reciprocally moved in the vertical direction as indicated by an arrow in the figure, by means of the elevation shaft 112. Note that a stretchable air-tight member 115 (e.g., bellows) for maintaining the processing chamber 102 in air-tight condition is provided between the susceptor 110 and the support plate 108, so as to surround the elevation shaft 112 from outside.

The susceptor 110 is formed of aluminum whose surface is subjected to oxidization processing. In order to maintain a wafer W on the susceptor 110 at a predetermined temperature, a temperature adjuster means (not shown), a heater means (not shown) such as a ceramics heater, and a cooling medium circulation path (not shown) for circulating a cooling medium through an external cooling medium source are provided in the susceptor 110. The temperature of the susceptor 110 (including a wafer W) is automatically controlled by a temperature sensor (not shown) and a temperature control mechanism (not shown).

The susceptor is electrically connected through a matching section to a high-frequency power source 140 for outputting a high-frequency power of a predetermined frequency (e.g., 2.0 MHz). As will be described later, in the apparatus 100 according to this embodiment, radicals and ions in plasma are efficiently injected into the processing surface of a wafer W on the susceptor 110 when a bias voltage is applied to the susceptor 110 from the high-frequency power source 140 during plasma processing.

On the susceptor 110, there is provided an electrostatic chuck 116 for electrically sucking and holding the wafer W. This electrostatic chuck 116 is constructed by, for example, embedding a conductive thin film 116a in polyimide-based resin 116b. In this case, the thin film 116a is electrically connected to a high voltage direct current power source 118 provided outside the processing vessel 104. Therefore, when a voltage is applied to the thin film by the high voltage direct current power source 118, a wafer W is sucked and held on the upper surface of the electrostatic chuck 116 (or the mounting surface of the susceptor 110) by a coulomb force. Naturally, the means for holding a wafer W on the mounting surface of the susceptor 110 is not limited to an electrostatic chuck 116, but may adopt a method of mechanically pressing the peripheral portion of a wafer W against the susceptor 110 by a clamp.

In order to make uniform the etching rate at the peripheral portion of a wafer W, a substantially ring-like focus ring 120 is provided at the outer circumferential portion of the susceptor 110 such that the focus ring 120 surrounds the electrostatic chuck 116. This focus ring 120 is made of, for example, quartz which has an electric insulating characteristic. A baffle plate 122 made of conductive material (e.g., aluminum-alumite) is fixed to the circumferential surface of the susceptor 110. Therefore, the baffle plate 122 moves up and down as the susceptor 110 moves up and down. In order to uniformly exhaust gases from the processing chamber 102, a number of through-holes 122a are formed in the baffle plate 122.

An upper electrode 130 is provided at a roof portion 104a of the processing vessel 104. As shown in FIG. 2, the upper electrode 130 consists of two ring-like electrodes 130a and 130b which have outer diameters different from each other, and the electrodes 130a and 130b are arranged with a predetermined distance maintained between each other, such that the electrodes are substantially coaxial to each other, forming part of the roof portion 104a. The inner electrode 130a is electrically connected to a high-frequency power source 134 for outputting a high-frequency power of a predetermined frequency (e.g., 13.56 MHz) through an amplifier 138b and a phase shifter 136. In addition, the outer electrode 130b positioned outside the inner electrode 130a is electrically connected to a high-frequency power source 134 through an amplifier 138a and the phase shifter 136. The amplifiers 138a and 138b and the phase shifter 136 are respectively connected to a control portion 199, so that the high-frequency powers supplied to the electrodes 130a and 130b from the high-frequency power source 134 can be controlled respectively and that the phases of the high frequency powers can be relatively controlled between the electrodes. In this embodiment, the electrodes 130a and 130b are formed in ring-like shapes in compliance with the shape of a wafer W as an object to be processed. However, when an LCD glass substrate is used as an object to be processed, each of the electrodes 130a and 130b can be formed in a substantially rectangular shape in compliance with the shape of the glass substrate.

A magnetic field formation means 132 for forming a magnetic field in the processing chamber 102 is provided by a fixed manner at an outer side of an upper portion of the processing vessel 104. The magnetic field formation means 132 consists of three permanent magnets 132a, 132b, and 132c formed in ring-like shapes in compliance with the outer shape of the electrodes 130a and 130b. The first permanent magnet 132a situated at the innermost position among the three magnets is provided inside the inner electrode 130a such that the magnet 132a is coaxial with the electrode 130a. The second permanent magnet 132b is provided between the inner electrode 130a and the outer electrode 130b such that the second permanent magnet 132b is coaxial with the electrodes 130a and 130b. The third permanent magnet 132c situated at the outermost position among the three magnets is provided outside the outer electrode 130b such that the magnet 132c is coaxial with the electrode 130b. Further, the permanent magnets 132*a*, 132*b*, and 132*c* are arranged such that two poles of each magnet are oriented in a direction substantially vertical to the roof surface 104*a* of the processing vessel 104 and such that the polarities of poles of the surfaces of the permanent magnets facing each other are different from each other. Specifically, in this embodiment, the first permanent magnet 132*a* and the third permanent magnet 132*c* are provided with their S-poles facing the processing vessel 104. The second permanent magnet 132*b* is provided with its N-pole facing the processing vessel 104.

In the following, explanation will be made to a case where an oxide film (SiO$_2$) on a wafer W is etched with use of the etching apparatus 100 constructed in the above structure.

At first, a gate valve 150 is opened and a wafer W is then transported into a processing chamber 102 from a load lock chamber 152 by the transport means 154. In this state, the susceptor 110 is driven to be elevated down by a motor 114, so that the susceptor 110 is moved to a stand-by position for receiving the wafer W. The wafer W is mounted onto the electrostatic chuck 116 by the transport means 154. Then, the transport means 154 escapes and the gate valve 150 is closed. Thereafter, the susceptor 110 is driven to be elevated up to a predetermined processing position, by the motor 114.

Next, the inner pressure of the processing chamber 102 is reduced to a predetermined vacuum by a vacuum suction means 124. Thereafter, for example, a CF$_4$ gas as a processing gas is introduced into the processing chamber 102 through a gas introduce tube 200 from a processing gas supply source not shown, and the pressure of the processing chamber 102 is set to and maintained at, for example, 10 mTorr. In this state, a high-frequency power of a predetermined frequency is supplied to electrodes 130*a* and 130*b* from a high-frequency power source 134 through a phase shifter 136 and amplifiers 138*a* and 138*b*, and then, plasma is generated in the processing chamber 102. In this case, electrons in the sheath region of plasma receive a force in the E×B direction (shown in FIGS. 1 and 4) due to an effect of a magnetic field generated in the processing chamber 102 by the permanent magnets 132*a*, 132*b*, and 132*c* and an effect of a high-frequency power supplied to the electrodes 130*a* and 130*b* in a multi-layer structure, and move circularly in the processing chamber 102. Specifically, inside an upper portion of the processing chamber 102, electrons in the sheath region move circularly in the clockwise direction (where the processing chamber 102 is viewed from the roof surface 104*a*) due to an electric field E extending toward the roof surface 104*a* and a magnetic field B extending toward the S-pole of the first permanent magnet 132*a* from the N-pole of the second permanent magnet 132*b*. Outside the upper portion of the processing chamber 102, electrons in the sheath region move circularly in the anti-clockwise direction (where the processing chamber 102 is viewed from the roof surface 104*a*) due to the electric field E extending toward the roof surface 104*a* and the magnetic field B extending toward the S-pole of the third permanent magnet 132*c* from the N-pole of the second permanent magnet 132*b*. Specifically, two circular flows of electrons in directions opposite to each other are formed in the processing chamber 102.

Thus, when a force F in E×B direction which circularly guides electrons in the sheath region of plasma along the shapes of the electrodes 130*a* and 130*b* is generated in the processing chamber 102, i.e., when electrons circularly move in the processing chamber 102 upon receipt of the force F in the E×B direction, the plasma density is made uniform over the entire plasma formation region, so that a uniform etching rate is obtained and damage to the wafer W are reduced. In addition, since the number of electrons which collide into the inner walls of the processing vessel 104 is reduced, plasma generation from a processing gas is accelerated. This contributes to generation of plasma with a high density under a low pressure.

Note that uniformity of the plasma density is improved much more when the high-frequency power supplied from the high-frequency power source 134 to the electrodes 130*a* and 130*b* is controlled individually for each of the electrodes or the phases of the high frequency powers are relatively controlled between the electrodes such that number, etc., of electrons moving circularly in the processing chamber is appropriately controlled respectively for inner and outer portions, i.e., such that the generation and diffusion of the plasma and an electron disappearance on an inner wall of the processing chamber 104 are balanced. For example, in case where a high-frequency power which is as twice large as the high-frequency power applied to the inner electrode 130*a* is applied to the outer electrode 130*b*, e.g., in case where a high-frequency power of 450 W is applied to the inner electrode 130*a* and a high-frequency power of 1 kW is applied to the outer electrode 130*b*, the plasma density is made uniform over the entire plasma formation region, as is indicated by the plot Δ in FIG. 3. The significant results of this will be easily known from comparison with another case in which high-frequency output control is performed on only one of the inner and outer electrodes 130*a* and 130*b* (indicated by plots ○ and □ in the figure). Of course, in this embodiment, if the upper electrode 130 is constructed in a multi-layer structure of three, four, or more layers, the number of correction points is increased and the uniformity of the plasma density is much more improved. This is particularly advantageous when an object to be processed has a large diameter.

Meanwhile, when a bias potential is applied to the susceptor 110 by applying a predetermined high-frequency voltage thereto from the high-frequency power source 140 with a predetermined timing shifted from the plasma state as described above, radicals and ions in plasma generated in the processing chamber 102 are efficiently injected into the surface of the wafer W to be processed, and the oxide film on the surface to be processed is etched. Upon completion of this etching processing, the processing chamber 102 is purged and the wafer W processed is transported out of the processing chamber 102 by the transport mechanism 154 through a reverse operation in which the wafer W is transported in.

Figure 5:
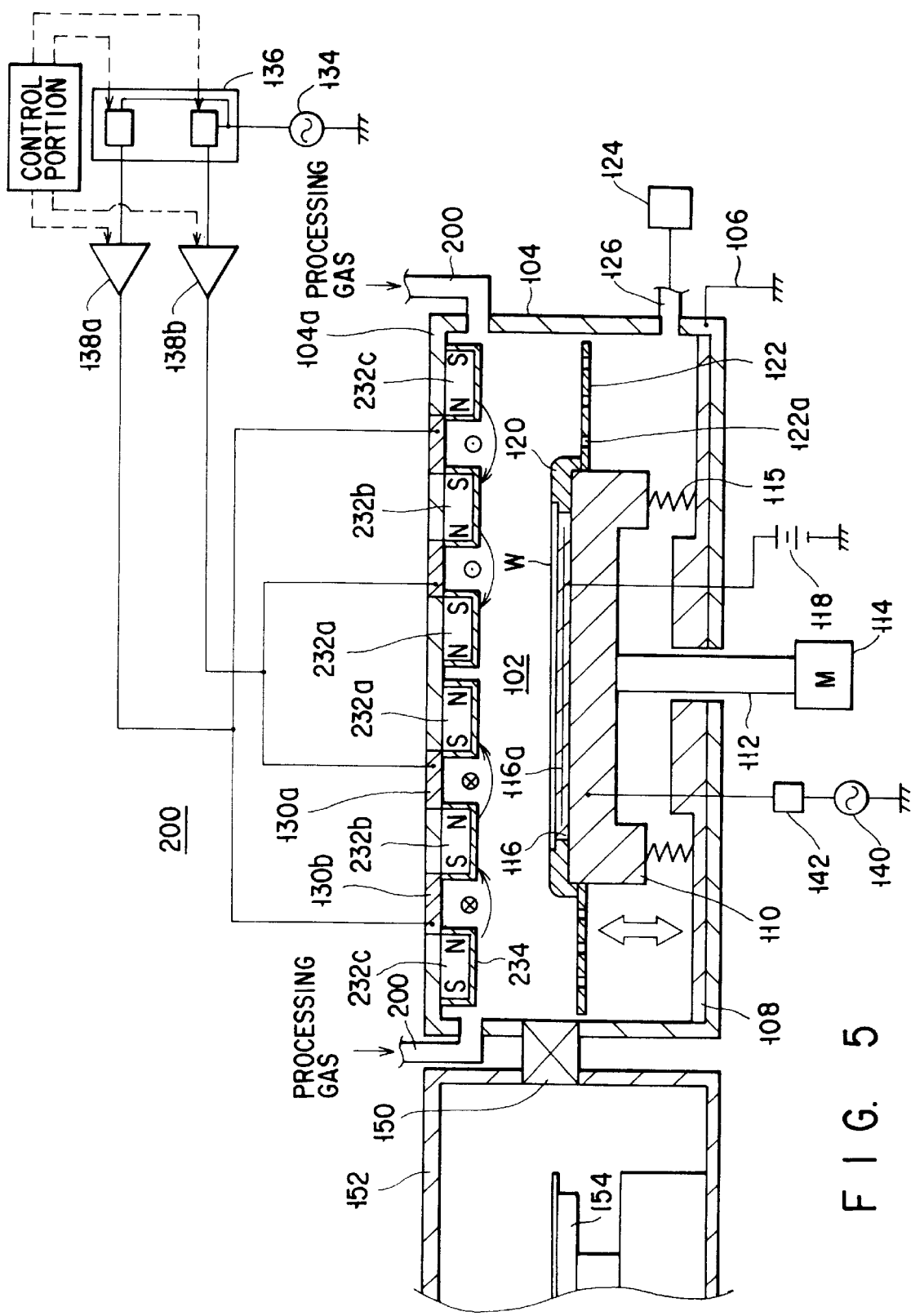
FIG. 5 is a cross-section schematically showing a plasma processing apparatus according to a second embodiment of the present invention.

FIGS. 5 and 6 show a second embodiment of the present invention. Note that the same components as those adopted in the first embodiment will be denoted by the same references and explanation of those components will be omitted herefrom.

As shown in FIG. 5, in the etching apparatus 200 according to the second embodiment, a magnetic field formation means for forming a magnetic field in the processing chamber 102 is provided inside the upper portion of the processing vessel 104. This magnetic field formation means consists of three permanent magnets 232*a*, 232*b*, and 232*c* formed in ring-like shapes in compliance with the outer shape of the electrodes 130*a* and 130*b*. The first permanent magnet 232*a* situated in the innermost position among the three magnets is provided inside the inner electrode 130*a* such that the magnet 232*a* is coaxial with the inner electrode 130*a*. The second permanent magnet 232*b* is provided between the inner and outer electrodes 130*a* and 130*b* such that the magnet 232*b* is coaxial with the electrodes 130*a* and 130*b*. The third permanent magnet 232*c* situated at the outermost position among the three magnets is provided outside the outer electrode 130b such that the magnet 232c is coaxial with the electrode 130b. Further, the permanent magnets 232a, 232b, and 232c are arranged such that two poles of each permanent magnet are oriented in the direction which is substantially parallel to the roof surface 104a of the processing vessel 104 and such that those poles of the permanent magnets which face each other have polarities different from each other (e.g., such that the N-poles are faced insides). The other structure of this embodiment is the same as that of the first embodiment.

In this structure, also, electrons in the sheath region of plasma generated in the processing chamber 102 receive a force in the E×B direction due to an effect of a magnetic field generated in the processing chamber 102 by the permanent magnets 232a, 232b, and 232c and an effect of a high-frequency power supplied to the electrodes 130a and 130b in a multi-layer structure, and move circularly in the processing chamber 102. Specifically, inside an upper portion of the processing chamber 102, electrons in the sheath region move circularly in the clockwise direction (where the processing chamber 102 is viewed from the roof surface 104a) due to an electric field E extending toward the roof surface 104a and a magnetic field B extending toward the S-pole of the first permanent magnet 232a from the N-pole of the second permanent magnet 232b. Outside the upper portion of the processing chamber 102, electrons in the sheath region move circularly in the clockwise direction (where the processing chamber 102 is viewed from the roof surface 104a) due to the electric field E extending toward the roof surface 104a and the magnetic field B extending toward the S-pole of the second permanent magnet 232b from the N-pole of the third permanent magnet 232c. Specifically, two circular flows of electrons in one same direction are formed in the processing chamber 102.

Therefore, the same effects as obtained in the etching apparatus 100 described above can be attained by the etching apparatus 200 according to this embodiment. Specifically, the plasma density is made uniform over the entire plasma formation region and the electron density in the sheath region is increased, so that plasma with a high density can be stably obtained under a low pressure.

Note that in this embodiment, the surfaces of the permanent magnets 232a, 232b, and 232c should preferably be covered with material 234 such as quartz or ceramics which is difficult to be sputtered, since the permanent magnets 232a, 232b, and 232c are provided in the processing chamber 102.

FIG. 7 shows a third embodiment of the present invention. In the etching apparatus 300 according to this embodiment, a magnetic field formation means is provided at the roof portion 104a of the processing vessel 104. This magnetic field formation means consists of a first permanent magnet 332a, and second and third permanent magnets 332b and 332c which are formed in ring-like shapes in compliance with the outer shapes of the electrodes 130a and 130b. These permanent magnets 332a, 332b, and 332c are arranged so as to form part of the roof portion 104a. The first permanent magnet 332a situated at the innermost position among the three magnets is arranged to be engaged in an inner hole of the ring-like inner electrode 130a. In addition, the second permanent magnet 332b is arranged to be engaged between the inner electrode 130a and the outer electrode 130b, such that the magnet 332b is coaxial with the electrodes 130a and 130b. Further, the outermost third permanent magnet 332c is provided outside the outer electrode 130b, such that the third magnet 332c is adjacent to and coaxial with the outer electrode 130b. Further, the first permanent magnet 332a is arranged such that two poles of this magnet are oriented in a direction substantially vertical to the roof surface 104a of the processing vessel 104 and such that the S-pole of this magnet faces the processing vessel 104. The second and third permanent magnets 332b and 332c arranged such that two poles of each of these magnets are oriented in a direction substantially parallel with the roof surface 104a of the processing vessel 104 and such that those poles of these permanent magnets which face each other have polarities different from each other (e.g., such that the N-poles are faced inside). The other structure of this embodiment is the same as that of the second embodiment.

In the case of this structure, inside an upper portion of the processing chamber 102, electrons in the sheath region move circularly in the clockwise direction (where the processing chamber 102 is viewed from the roof surface 104a) due to an electric field E extending toward the roof surface 104a and a magnetic field B extending toward the S-pole of the first permanent magnet 332a from the N-pole of the second permanent magnet 332b. Outside the upper portion of the processing chamber 102, electrons in the sheath region move circularly in the clockwise direction (where the processing chamber 102 is viewed from the roof surface 104a) due to the electric field E extending toward the roof surface 104a and the magnetic field B extending toward the S-pole of the second permanent magnet 332b from the N-pole of the third permanent magnet 332c. Specifically, two circular flows of electrons in one same direction are formed in the processing chamber 102. Thus, the same effects as those of the second embodiment can be attained.

Figure 8:
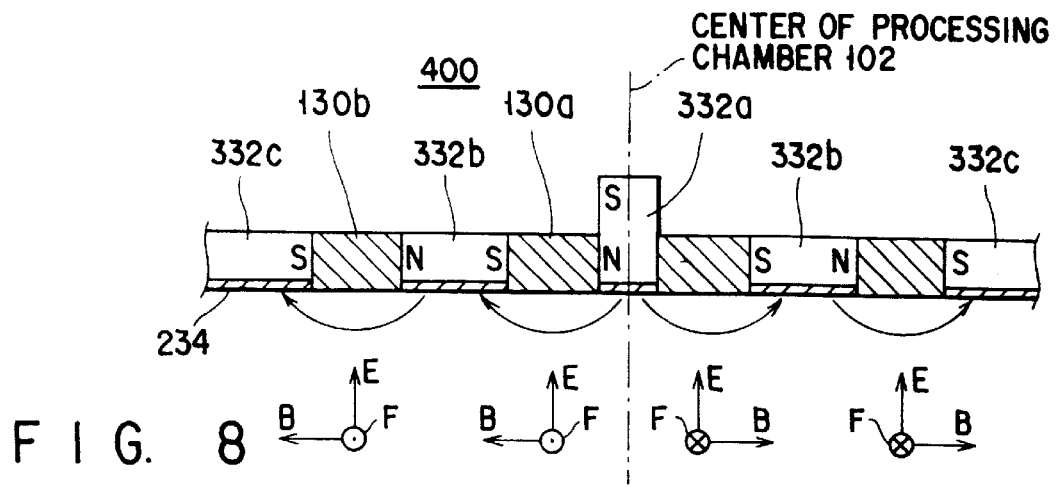
FIG. 8 is a cross-section of a main part of a plasma processing apparatus according to a fourth embodiment of the present invention.

FIG. 8 shows a fourth embodiment of the present invention. In the etching apparatus 400 according to this embodiment, the first permanent magnet 332a is arranged such that its N-pole faces the processing vessel 104, and the second and third permanent magnets 332b and 332c are arranged such that the S-poles of these magnets face inside. The other structure of this embodiment is the same as that of the third embodiment.

In this structure, inside an upper portion of the processing chamber 102, electrons in the sheath region move circularly in the anti-clockwise direction (where the processing chamber 102 is viewed from the roof surface 104a) due to an electric field E extending toward the roof surface 104a and a magnetic field B extending toward the S-pole of the second permanent magnet 332b from the N-pole of the first permanent magnet 332a. Outside the upper portion of the processing chamber 102, electrons in the sheath region move circularly in the anti-clockwise direction (where the processing chamber 102 is viewed from the roof surface 104a) due to the electric field E extending toward the roof surface 104a and the magnetic field B extending toward the S-pole of the third permanent magnet 332c from the N-pole of the second permanent magnet 332b. Specifically, two circular flows of electrons in one same direction are formed in the processing chamber 102. Thus, the same effects as those of the third embodiment can be attained.

Figure 9:
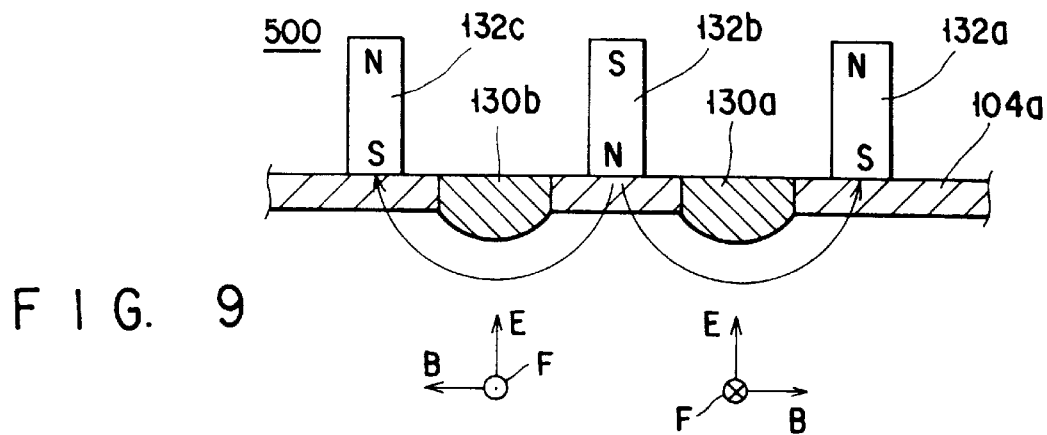
FIG. 9 is a cross-section of a main part of the plasma processing apparatus according to the fourth embodiment of the present invention.
Figure 10:
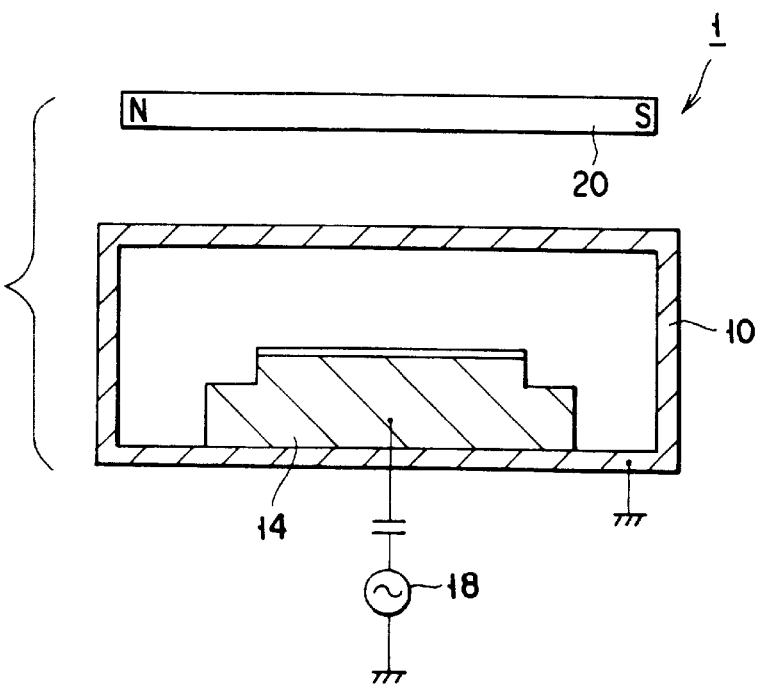
FIG. 10 is a cross-section schematically showing the structure of a conventional magnetic-field assist type etching apparatus.

FIG. 9 shows a fifth embodiment of the present invention. The etching apparatus 500 according to this embodiment is different from the apparatus of the first embodiment only in that the shapes of the electrodes 130a and 130b are different from those of the first embodiment. The other structure of this embodiment is the same as that of the first embodiment. Specifically, the electrodes 130a and 130b of this embodiment are formed such that the surfaces of these electrodes facing the processing chamber 102 are curved surfaces extending along the direction of the line of magnetic force.

By forming the electrodes 130a and 130b in the shapes as described above, plasma is generated uniformly along the entire surface of the electrodes 130a and 130b, sputtering on the electrodes 130a and 130b is uniform so that the lifetime of the electrodes 130a and 130b is elongated.

Note that the present invention is not limited to the embodiments described above, but can be variously modified without derivating from the subject matter of the invention. For example, the arrangement and structure of electrodes and magnets may be variously changed as long as electrons in the sheath region of plasma can be moved circularly in the processing chamber 102 by a force F in the direction E×B and as long as the high-frequency power supplied to the electrodes 130a and 130b from the high-frequency power source 134 can be individually controlled for each of the electrodes and the phases of the high frequency powers can be relatively controlled between the electrodes. Specifically, magnets may be electro-magnets in place of permanent magnets, and an electromagnetic shield may be provided between adjacent electrodes if an interference between electrodes occurs as a problem due to the multi-layer structure of electrodes. Further, although the above embodiments have been explained with respect to a case the structure of the present invention is adopted in an etching apparatus, the structure of the present invention is naturally applicable to an ashing apparatus, a sputtering apparatus, a CVD apparatus, or the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A plasma processing apparatus comprising:
   a processing chamber in which an object to be processed is processed;
   gas introduce means for introducing a processing gas into the processing chamber;
   an upper electrode comprising a part of an upper wall portion of the processing chamber and supplied with a high-frequency power, to form plasma from the processing gas in the processing chamber;
   magnetic field formation means provided fixedly on the upper wall portion of the processing chamber, for forming a magnetic field in the processing chamber; and
   a lower electrode provided at a lower portion in the processing chamber, having a mount surface where the object is mounted, and applied with a bias voltage;
   wherein the upper electrode and the magnetic field formation means are positioned in such a way that a force for moving circularly in the plasma is generated in the processing chamber and such that two or more circular flows of electrons which are substantially coaxial with each other and have turning radii different from each other are generated by the force.

2. A plasma processing apparatus according to claim 1, wherein the upper electrode consists of a plurality of electrode portions and the high-frequency powers are controlled individually for each of the electrode portions and the phases of the high frequency powers are relatively controlled.

3. A plasma processing apparatus according to claim 1, wherein the upper electrode comprises a plurality of circular members which are arranged substantially concentric with each other.

4. A plasma processing apparatus according to claim 1, wherein the magnetic field formation means and the upper electrode are parts of the upper chamber wall of the processing chamber.

5. A plasma processing apparatus according to claim 1, wherein the upper electrode and the lower electrode are plate-shaped, and located parallel to each other and opposite to each other.

6. A plasma processing apparatus according to claim 1, wherein:
   the upper electrode comprises a plurality of circular members which are arranged substantially concentric with each other;
   high frequency powers to be supplied to the circular members are controlled individually, and phases of the high frequency powers are relatively controlled; and
   the upper electrode and the lower electrode are plate-shaped, and located parallel to each other and opposite to each other.

7. A plasma processing apparatus comprising:
   a processing chamber in which an object to be processed is processed;
   gas introduce means for introducing a processing gas into the processing chamber;
   an upper electrode provided fixedly on a roof portion of the processing chamber and supplied with a high-frequency power, to form plasma from the processing gas in the processing chamber; and
   magnetic field formation means provided fixedly on the roof portion of the processing chamber, for forming a magnetic field in the processing chamber; and
   wherein the upper electrode and the magnetic field formation means are positioned in such a way that a force for moving circularly electrons in the plasma is generated in the processing chamber and such that two or more circular flows of electrons which are substantially coaxial with each other and have turning radii different from each other are generated by the force; and
   wherein the upper electrode consists of a plurality of ring-like electrode portions arranged to be substantially coaxial with each other, the magnetic field formation means consists of a plurality of ring-like magnets arranged to be substantially coaxial with each other, and the magnets are individually provided between the electrodes or inside the electrodes, to be substantially coaxial with the electrodes, such that poles of adjacent magnets which face each other have polarities different from each other.

8. A plasma processing apparatus according to claim 7, comprising:
   a lower electrode provided at a lower portion in the processing chamber, having a mount surface where the object is mounted, and applied with a bias voltage.

9. A plasma process apparatus comprising:
   a processing chamber in which an object to be processed is processed;
   gas introduce means for introducing a processing gas into the processing chamber;
   an upper electrode provided fixedly on a roof portion of the processing chamber and supplied with a high-frequency power, to form plasma from the processing gas in the processing chamber; and
   magnetic field formation means provided fixedly on the roof portion of the processing chamber, for forming a magnetic field in the processing chamber;

wherein the upper electrode and the magnetic field formation means are positioned in such a way that a force for moving circularly electrons in the plasma is generated in the processing chamber and such that two or more circular flows of electrons which are substantially coaxial with each other and have turning radii different from each other are generated by the force; and wherein the upper electrode is formed such that a surface of the upper electrode facing the processing chamber constitutes curved surface extending along a direction of a line of magnetic force of the magnetic field generated in the processing chamber.

10. A plasma processing apparatus comprising:

a processing chamber in which an object to be processed is processed;

a lower electrode provided at a lower portion in the processing chamber, having a mount surface where the object is mounted, and applied with a bias voltage;

gas introduce means for introducing a processing gas into the processing chamber;

a first ring-like upper electrode provided fixedly on a roof portion of the processing chamber and supplied with a high-frequency power for forming plasma from the processing gas in the processing chamber;

a second ring-like upper electrode provided fixedly on the roof portion of the processing chamber outside the first ring-like upper electrode, to be substantially coaxial with the first ring-like upper electrode, and supplied with a high-frequency power for forming plasma from the processing gas in the processing chamber;

a first ring-like magnet provided fixedly on the roof portion of the processing chamber inside the first ring-like upper electrode, to be substantially coaxial with the first ring-like upper electrode, for generating a magnetic field in the processing chamber;

a second ring-like magnet provided fixedly between the first and second ring-like upper electrodes on the roof portion of the processing chamber, to be substantially coaxial with the first and second ring-like upper electrodes, for generating a magnetic field in the processing chamber; and a third ring-like magnet provided fixedly on the roof portion of the processing chamber and positioned outside the second ring-like upper electrode, to be substantially coaxial with the second ring-like upper electrode, for forming a magnetic field in the processing chamber, wherein the first, second, and third ring-like magnets are arranged such that any adjacent two of the magnets have poles facing each other, polarities of which are different from each other, and the magnetic field generated in the processing chamber by the magnets generates a force for moving circularly electrons in the plasma and generates two circular flows of electrons which have turning radii different from each other and which are substantially coaxial with each other.

11. A plasma processing apparatus according to claim 10, wherein the high-frequency powers are controlled individually for each of the first and second ring-like upper electrodes and the phases of the high frequency powers are relatively controlled.

12. A plasma processing apparatus according to claim 10, wherein the first and second ring-like upper electrodes are formed such that a surface of each of the upper electrodes facing the processing chamber constitutes a curved surface extending along a direction of a line of magnetic force of the magnetic field generated in the processing chamber.

13. A plasma processing apparatus according to claim 10, wherein the two circular flows of electrons have one same turning direction.

14. A plasma processing apparatus according to claim 10, wherein the two circular flows of electrons have turning directions opposite to each other.

15. A plasma processing apparatus comprising:

a processing chamber in which an object to be processed is processed;

a lower electrode provided at a lower portion in the processing chamber, having a mount surface where the object is mounted, and applied with a bias voltage;

gas introduce means for introducing a processing gas into the processing chamber;

a first ring-like upper electrode provided fixedly on a roof portion of the processing chamber and supplied with a high-frequency power for forming plasma from the processing gas in the processing chamber;

a second ring-like upper electrode provided fixedly on the roof portion of the processing chamber outside the first ring-like upper electrode, to be substantially coaxial with the first ring-like upper electrode, and supplied with a high-frequency power for forming plasma from the processing gas in the processing chamber;

a first magnet provided fixedly on the roof portion of the processing chamber, to be positioned inside the first ring-like upper electrode, for generating a magnetic field in the processing chamber;

a first ring-like magnet provided fixedly between the first and second ring-like upper electrodes on the roof portion of the processing chamber, to be substantially coaxial with the first and second ring-like upper electrodes, for generating a magnetic field in the processing chamber; and a second ring-like magnet provided fixedly on the roof portion of the processing chamber and positioned outside the second ring-like upper electrode, to be substantially coaxial with the second ring-like upper electrode, for forming a magnetic field in the processing chamber, wherein the first magnet and the first and second ring-like magnets are arranged such that any adjacent two of the magnets have poles facing each other, polarities of which are different from each other, and the magnetic field generated in the processing chamber by the magnets generates a force for moving circularly electrons in the plasma and generates two circular flows of electrons which have turning radii different from each other and which are substantially coaxial with each other.

16. A plasma processing apparatus according to claim 15, wherein the high-frequency powers are controlled individually for each of the first and second ring-like upper electrodes and the phases of the high frequency powers are relatively controlled.

17. A plasma processing apparatus according to claim 15, wherein the two circular flows of electrons have turning directions opposite to each other.

* * * * *